(12) United States Patent
Rathinasamy et al.

(10) Patent No.: US 11,839,051 B2
(45) Date of Patent: Dec. 5, 2023

(54) BI-DIRECTIONAL AIRFLOW POWER SUPPLY MODULE

(71) Applicant: Dell Products L.P., Round Rock, TX (US)

(72) Inventors: Shree Rathinasamy, Round Rock, TX (US); Neal Beard, Austin, TX (US); Kannan Karuppiah, Fremont, CA (US)

(73) Assignee: Dell Products L.P., Round Rock, TX (US)

( * ) Notice: Subject to any disclaimer, the term of this patent is extended or adjusted under 35 U.S.C. 154(b) by 307 days.

(21) Appl. No.: 17/477,726

(22) Filed: Sep. 17, 2021

(65) Prior Publication Data
US 2023/0089775 A1    Mar. 23, 2023

(51) Int. Cl.
*H05K 7/20* (2006.01)
*H05K 7/14* (2006.01)

(52) U.S. Cl.
CPC ....... *H05K 7/20145* (2013.01); *H05K 7/1492* (2013.01); *H05K 7/14* (2013.01); *H05K 7/20* (2013.01)

(58) Field of Classification Search
CPC ............. H05K 7/20145; H05K 7/1492; H05K 7/20172; H05K 7/20718; H05K 7/20; H05K 7/14

USPC ............................................. 361/695, 679.53
See application file for complete search history.

(56) References Cited

U.S. PATENT DOCUMENTS

| 8,477,491 B1* | 7/2013 | Ross | H05K 7/20736 361/679.48 |
| 2012/0194350 A1* | 8/2012 | Crisp | G06F 1/26 340/815.42 |

\* cited by examiner

*Primary Examiner* — Danny Nguyen
(74) *Attorney, Agent, or Firm* — Jackson Walker L.L.P

(57) ABSTRACT

An information handling system may include a chassis configured to house components of the information handling system and a modular power supply module configured to be readily removable from the chassis. The modular power supply module may include an enclosure, power supply components housed within the enclosure, an air mover configured to drive airflow to cool one or more components of the information handling system, and a mechanical assembly configured to mechanically couple the air mover to the enclosure that enables a user to remove the air mover from the enclosure while still coupled to the enclosure via the mechanical assembly, rotate the air mover 180 degrees relative to the enclosure while still coupled to the enclosure via the mechanical assembly, and reinsert the air mover into the enclosure, in order to modify a direction of airflow driven by the air mover.

18 Claims, 13 Drawing Sheets

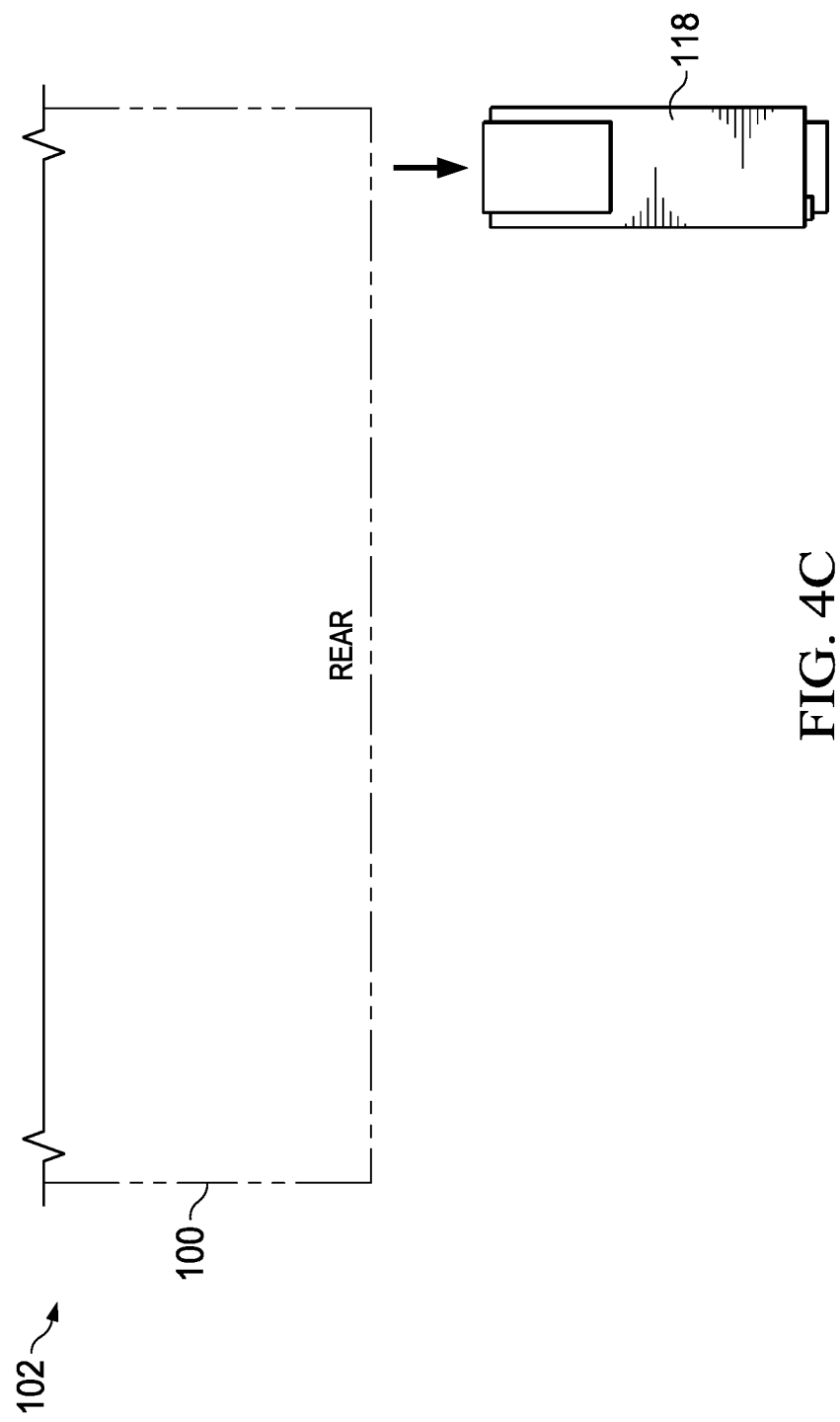

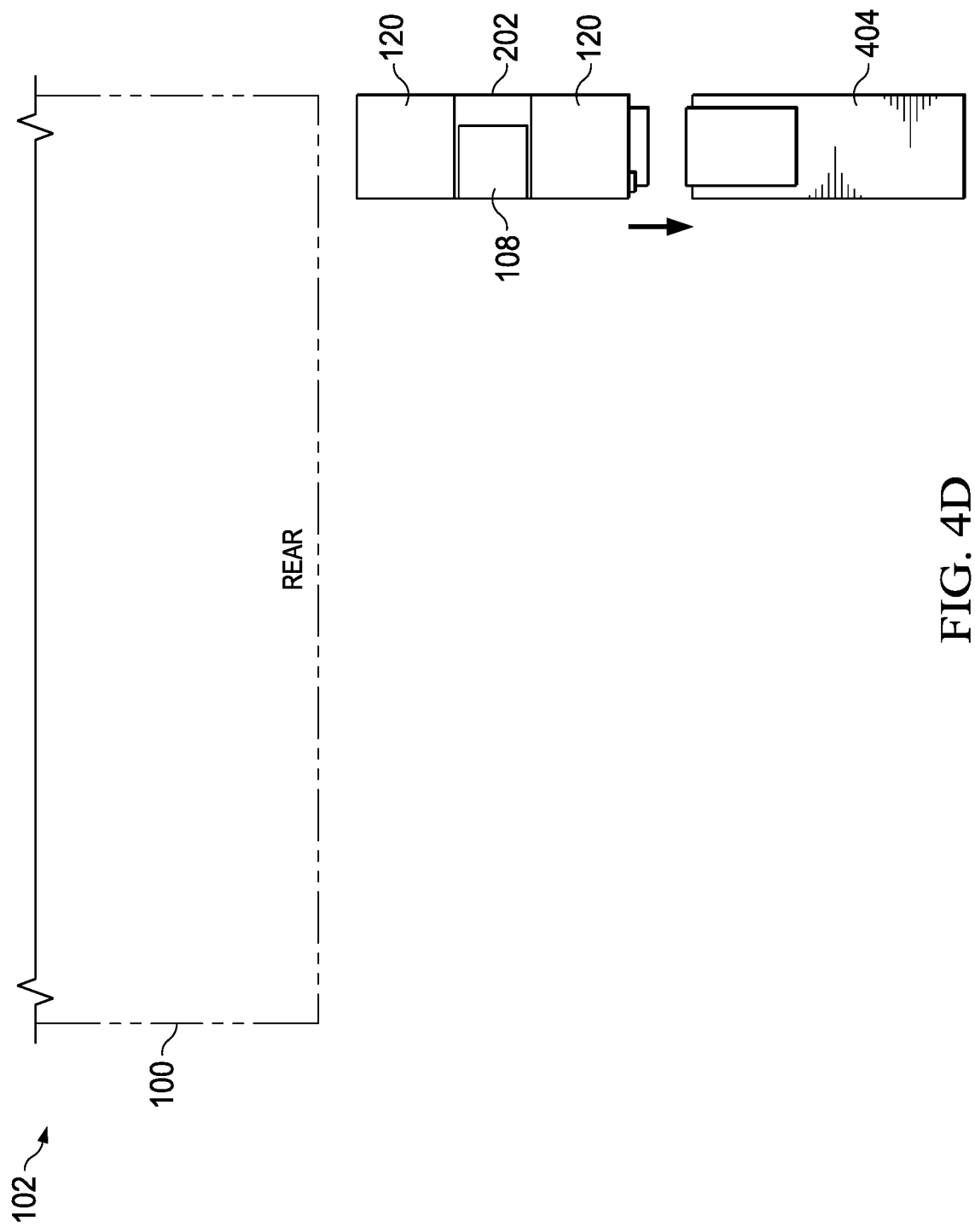

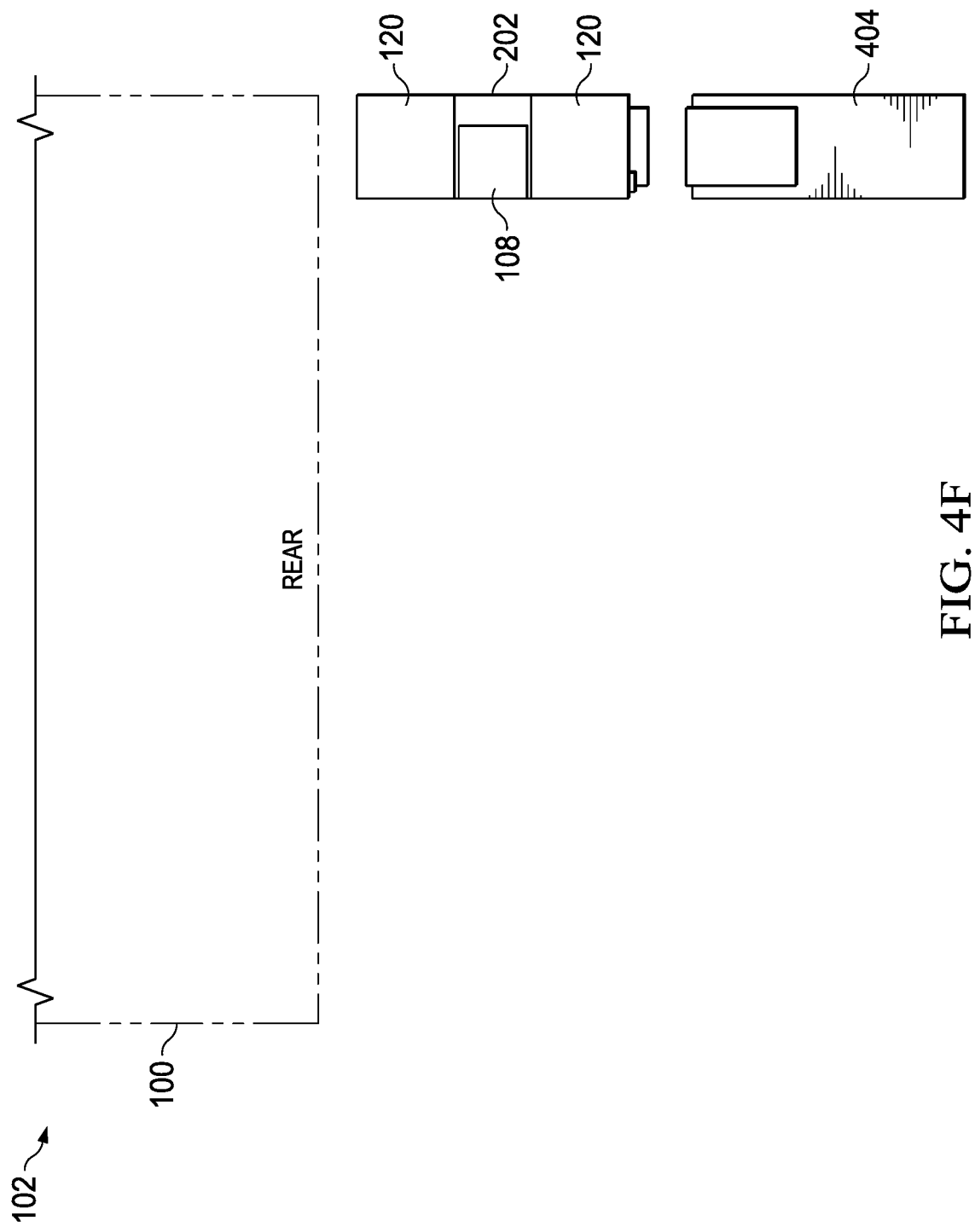

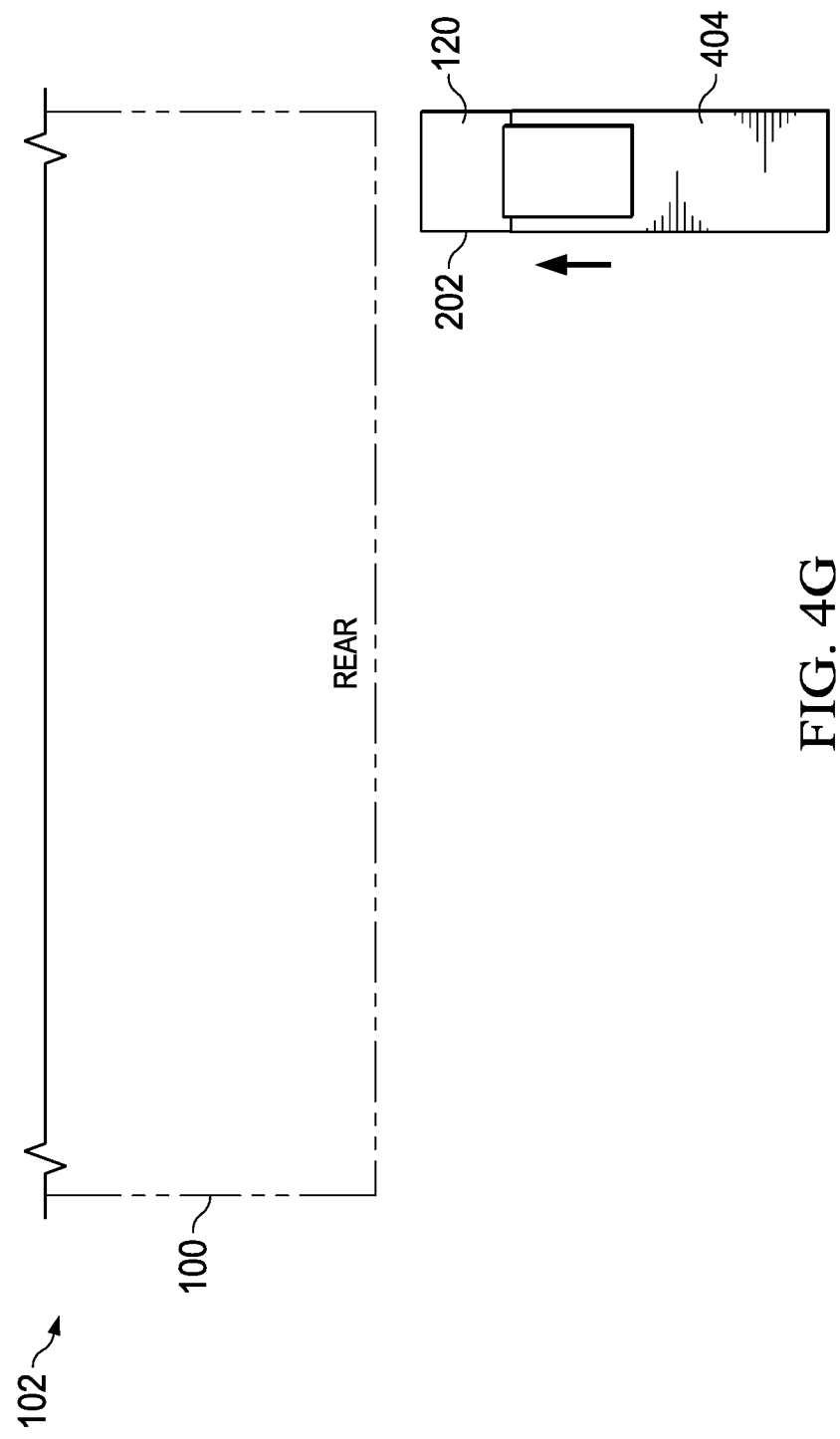

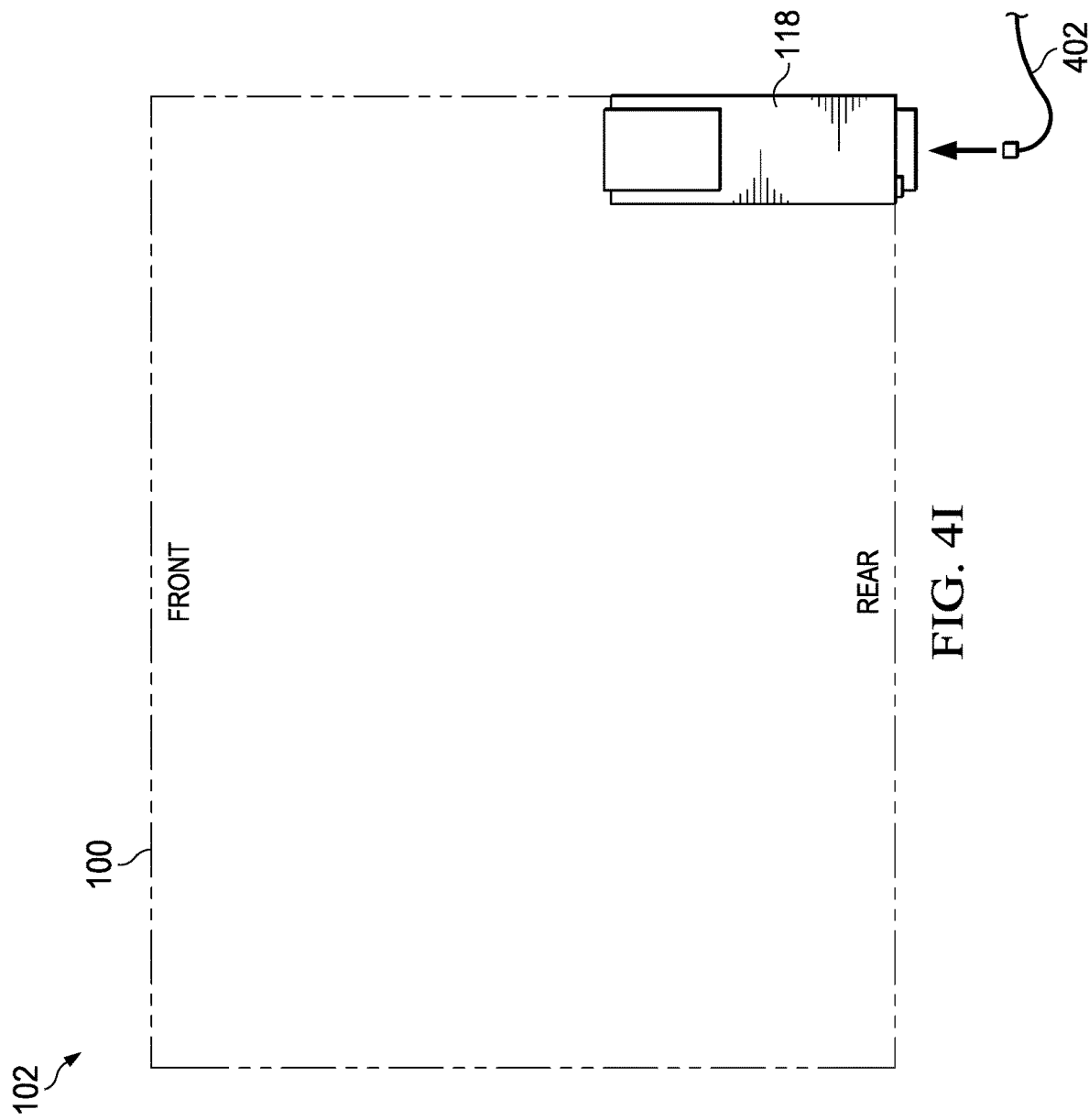

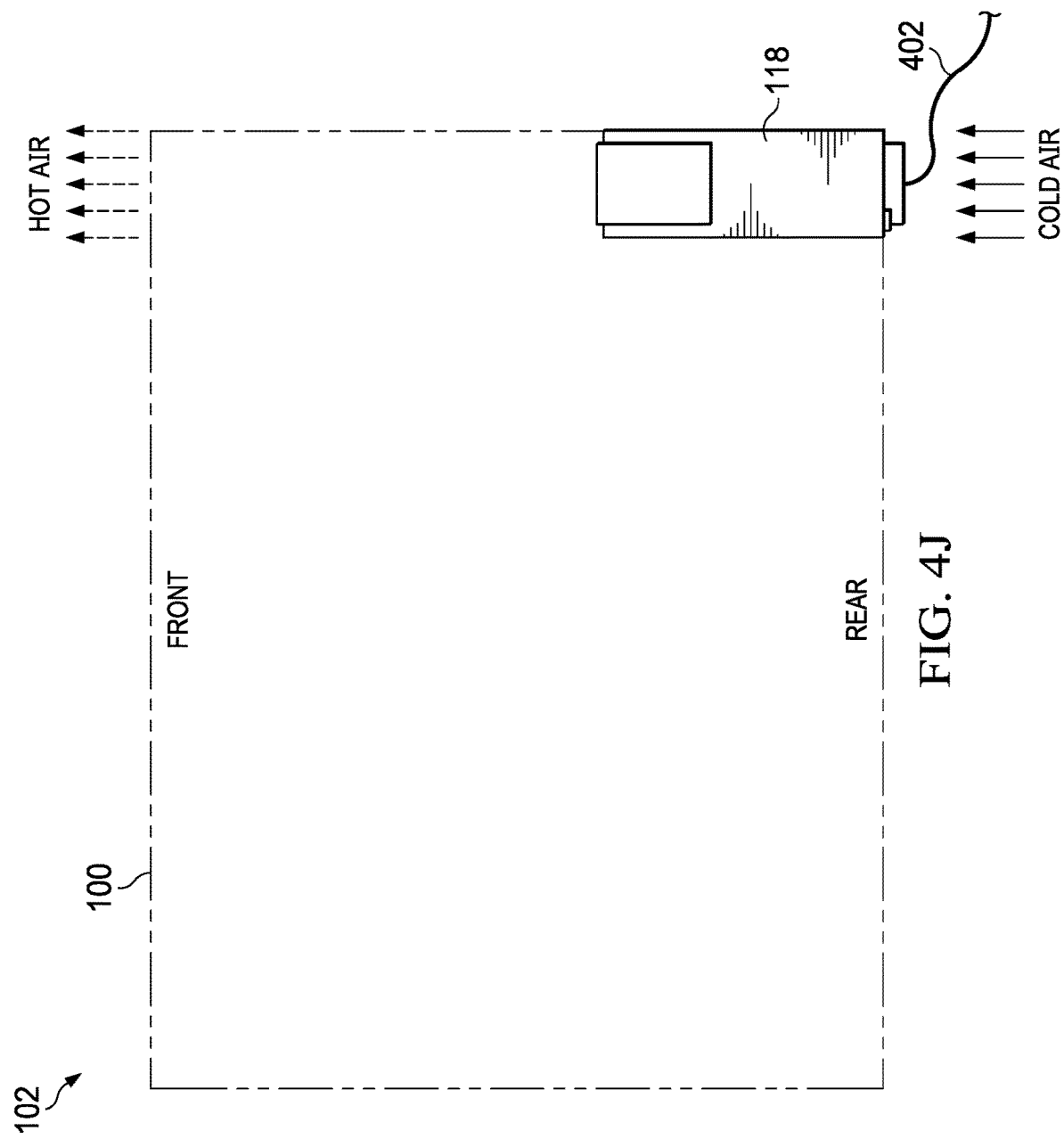

BI-DIRECTIONAL AIRFLOW POWER SUPPLY MODULE

TECHNICAL FIELD

The present disclosure relates in general to information handling systems, and more particularly to cooling of information handling system components using airflow driven by one or more air movers, and in particular, systems and methods for changing airflow direction of an air mover integral to a power supply module.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

Networking switches often include air movers and power supply unit (PSU) modules. Typically, it may be desirable that air mover modules and PSU modules be in the same direction of airflow. Many information handling systems, including network switches, are designed such that airflow can be in a forward direction (e.g., from a front of an information handling system to a rear of the information handling system) or a reverse direction (e.g., from a rear of the information handling system to the front of the information handling system). A datacenter physical layout of characteristics of a cooling system may determine the optimal airflow direction. Traditionally, different air mover modules are used depending on whether airflow is desired in the forward direction or the reverse direction.

Incorrect airflow direction may lead to high temperatures within an information handling system, which may negatively affect operability of components. In the case that a user orders air mover modules with incorrect airflow direction, the user may need to replace such air mover modules with air mover modules having the correct airflow direction, which may be time consuming. In some instances, incorrect airflow direction may go unnoticed, and users may notice an issue only after significant increases in temperature that lead to high air mover speed that results in loud noise from air movers.

SUMMARY

In accordance with the teachings of the present disclosure, the disadvantages and problems associated with thermal control of information handling resources may be substantially reduced or eliminated.

In accordance with embodiments of the present disclosure, an information handling system may include a chassis configured to house components of the information handling system and a modular power supply module configured to be readily removable from the chassis. The modular power supply module may include an enclosure, power supply components housed within the enclosure, an air mover configured to drive airflow to cool one or more components of the information handling system, and a mechanical assembly configured to mechanically couple the air mover to the enclosure that enables a user to remove the air mover from the enclosure while still coupled to the enclosure via the mechanical assembly, rotate the air mover 180 degrees relative to the enclosure while still coupled to the enclosure via the mechanical assembly, and reinsert the air mover into the enclosure, in order to modify a direction of airflow driven by the air mover.

In accordance with these and other embodiments of the present disclosure, a modular power supply module may be configured to be readily removable from a chassis of an information handling system, and the modular power supply module may include an enclosure, power supply components housed within the enclosure, an air mover configured to drive airflow to cool one or more components of the information handling system, and a mechanical assembly configured to mechanically couple the air mover to the enclosure that enables a user to remove the air mover from the enclosure while still coupled to the enclosure via the mechanical assembly, rotate the air mover 180 degrees relative to the enclosure while still coupled to the enclosure via the mechanical assembly, and reinsert the air mover into the enclosure, in order to modify a direction of airflow driven by the air mover.

In accordance with these and other embodiments of the present disclosure, a method may include mechanically coupling a mechanical assembly to an enclosure of a modular power supply module configured to be readily removable from a chassis of an information handling system and mechanically coupling the mechanical assembly to an air mover configured to drive airflow to cool one or more components of an information handling system into which the mechanical assembly is inserted, such that the air mover is removable from the enclosure while still coupled to the enclosure via the mechanical assembly, the air mover is rotatable 180 degrees relative to the enclosure while still coupled to the enclosure via the mechanical assembly, the air mover is reinsertable into the enclosure, in order to modify a direction of airflow driven by the air mover.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIGS. 4A-4J illustrate top plan views of selected components of the information handling system of FIG. 1, in accordance with embodiments of the present disclosure.

DETAILED DESCRIPTION

Preferred embodiments and their advantages are best understood by reference to FIGS. 1 through 4J, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

Figure 1:
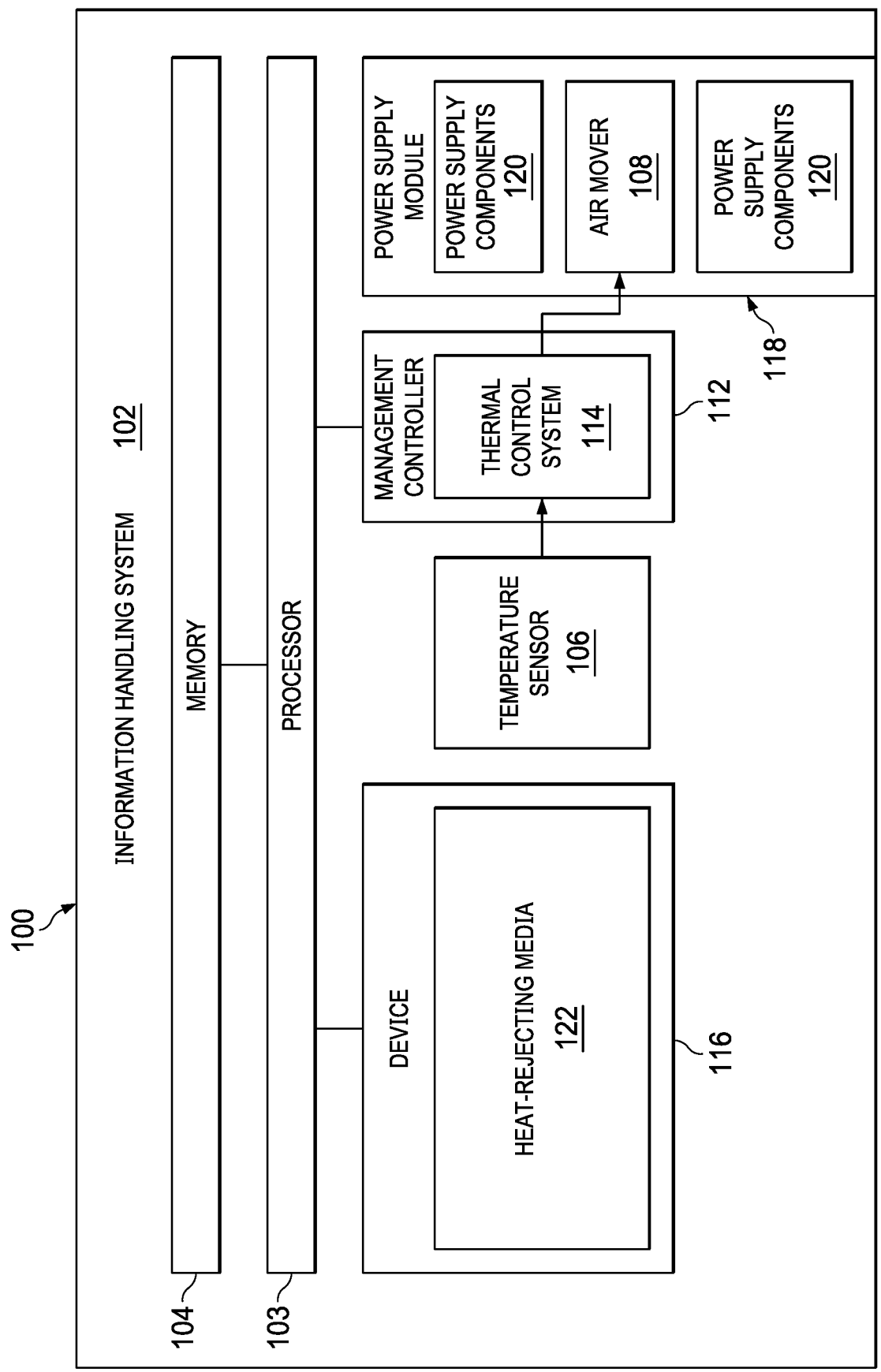
FIG. 1 illustrates a block diagram of an example information handling system, in accordance with embodiments of the present disclosure.

FIG. 1 illustrates a block diagram of an example information handling system 102, in accordance with embodiments of the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data. In yet other embodiments, information handling system 102 may include a network switch. As shown in FIG. 1, information handling system 102 may include a chassis 100 housing a processor 103, a memory 104, a temperature sensor 106, a management controller 112, a device 116, heat-rejecting media 122, and a removable power supply module 118.

Processor 103 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may comprise any system, device, or apparatus operable to retain program instructions or data for a period of time. Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off.

Management controller 112 may comprise any system, device, or apparatus configured to facilitate management and/or control of information handling system 102 and/or one or more of its component information handling resources. Management controller 112 may be configured to issue commands and/or other signals to manage and/or control information handling system 102 and/or its information handling resources. Management controller 112 may comprise a microprocessor, microcontroller, DSP, ASIC, field programmable gate array ("FPGA"), EEPROM, or any combination thereof. Management controller 112 also may be configured to provide out-of-band management facilities for management of information handling system 102. Such management may be made by management controller 112 even if information handling system 102 is powered off or powered to a standby state. In certain embodiments, management controller 112 may include or may be an integral part of a baseboard management controller (BMC), a remote access controller (e.g., a Dell Remote Access Controller or Integrated Dell Remote Access Controller), or an enclosure controller. In other embodiments, management controller 112 may include or may be an integral part of a chassis management controller (CMC).

As shown in FIG. 1, management controller 112 may include a thermal control system 114. Thermal control system 114 may include any system, device, or apparatus configured to receive one or more signals indicative of one or more temperatures within information handling system 102 (e.g., one or more signals from one or more temperature sensors 106), and based on such signals, calculate an air mover driving signal to maintain an appropriate level of cooling, increase cooling, or decrease cooling, as appropriate, and communicate such air mover driving signal to air mover 108. In these and other embodiments, thermal control system 114 may be configured to receive information from other information handling resources and calculate the air mover driving signal based on such received information in addition to temperature information. For example, as described in greater detail below, thermal control system 114 may receive configuration data from device 116 and/or other information handling resources of information handling system 102, which may include thermal requirements information of one or more information handling resources. In addition to temperature information collected from sensors within information handling system 102, thermal control system 114 may also calculate the air mover driving signal based on such information received from information handling resources.

Temperature sensor 106 may be any system, device, or apparatus (e.g., a thermometer, thermistor, etc.) configured to communicate a signal to management controller 112 or another controller indicative of a temperature within information handling system 102. In many embodiments, information handling system 102 may comprise a plurality of temperature sensors 106, wherein each temperature sensor 106 detects a temperature of a particular component and/or location within information handling system 102.

Device 116 may comprise any component information handling system of information handling system 102, including without limitation processors, buses, memories, I/O devices and/or interfaces, storage resources, network interfaces, motherboards, integrated circuit packages, electro-mechanical devices, displays, and power supplies.

As shown in FIG. 1, device 116 may have mechanically and thermally coupled thereto heat-rejecting media 122. Heat-rejecting media 122 may include any system, device, or apparatus configured to transfer heat from an information handling resource (e.g., device 116, as shown in FIG. 1), thus reducing a temperature of the information handling resource. For example, heat-rejecting media 122 may include a solid member thermally coupled to the information handling resource (e.g., heat spreader) such that heat generated by the information handling resource is transferred from the information handling resource into air surrounding the information handling resource. For example, in the embodiments represented by FIG. 1, heat-rejecting media 122 may be thermally coupled to device 116 and arranged such that heat generated by device 116 is transferred to air driven by air mover 108, as described in greater detail below.

Power supply module 118 may comprise a readily removable module that may be configured such that a person may easily slide power supply module 118 in and out of chassis 100, for example via rails and/or other mechanical guide features. As shown in FIG. 1, power supply module 118 may include power supply components 120 and an integrated air mover 108.

Power supply components 120 may together form a suitable system, device, or apparatus for delivering electrical energy to electric and/or electronic components of information handling system 102, and thus may include any suitable collection of converters, rectifiers, regulators, and/or other components.

Air mover 108 may include any mechanical, electrical, or electro-mechanical system, apparatus, or device operable to move air and/or other gases in order to cool information handling resources of information handling system 102. In some embodiments, air mover 108 may comprise a fan (e.g., a rotating arrangement of vanes or blades which act on the air). In other embodiments, air mover 108 may comprise a blower (e.g., a centrifugal fan that employs rotating impellers to accelerate air received at its intake and change the direction of the airflow). In these and other embodiments, rotating and other moving components of air mover 108 may be driven by a motor.

In yet other embodiments, air mover 108 may comprise a solid-state fan or other similar device that may be used to generate an airflow with no moving mechanical parts. A solid-state fan may use the principle of electro-aerodynamic pumping, based on corona discharge, to generate an ionized airflow. A solid-state fan may have advantages over traditional mechanical air movers in that a solid-state fan may generate less noise and may be less susceptible to failure of mechanical parts.

The speed of airflow driven by air mover 108 (e.g., rotational speed of a motor or voltage potential difference used to generate ionized airflow) may be controlled by an air mover control signal communicated from thermal control system 114 of management controller 112.

In operation, air mover 108 may cool information handling resources of information handling system 102 by drawing cool air into an enclosure housing the information handling resources from outside the chassis, expelling warm air from inside the enclosure to the outside of such enclosure, and/or moving air across one or more heat sinks (not explicitly shown) internal to the enclosure to cool one or more information handling resources.

In addition to processor 103, memory 104, temperature sensor 106, management controller 112, device 116, heat-rejecting media 122, and power supply module 118, information handling system 102 may include one or more other information handling resources. In addition, for the sake of clarity and exposition of the present disclosure, FIG. 1 depicts only one power supply module 118, one air mover 108, and one device 116. In embodiments of the present disclosure, information handling system 102 may include any number of power supply modules 118, air movers 108, and devices 116. However, in some embodiments, approaches similar or identical to those used to cool device 116 as described herein may be employed to provide cooling of processor 103, memory 104, management controller 112, and/or any other information handling resource of information handling system 102.

Figure 2A:
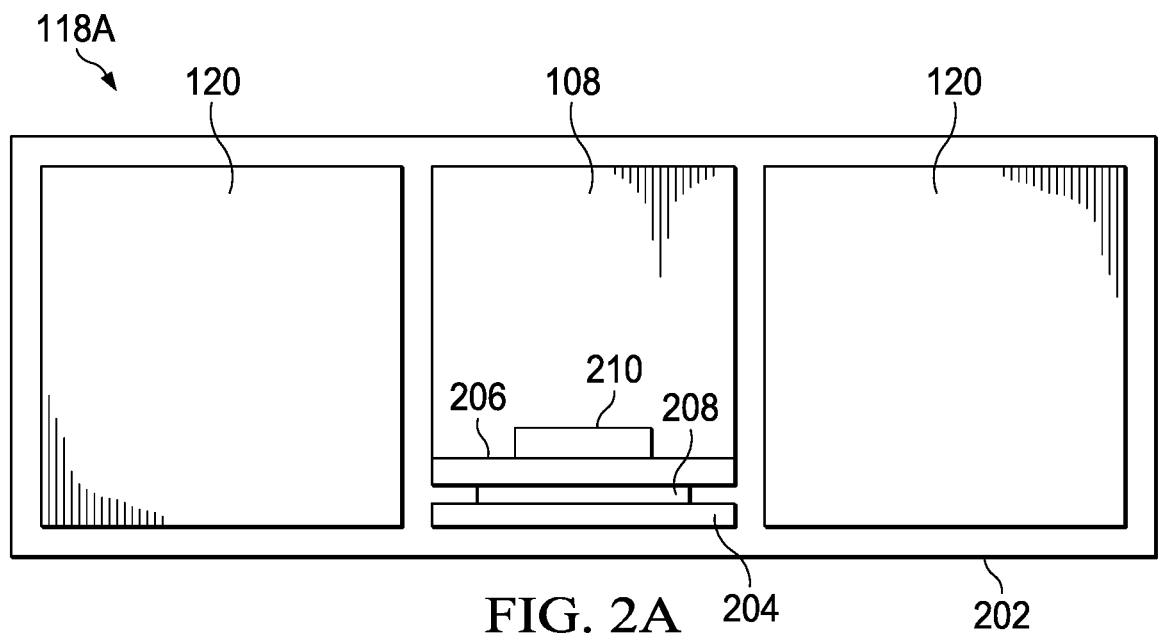
FIGS. 2A and 2B illustrate side elevation views of selected components of an example power supply module, in accordance with embodiments of the present disclosure.
Figure 2B:
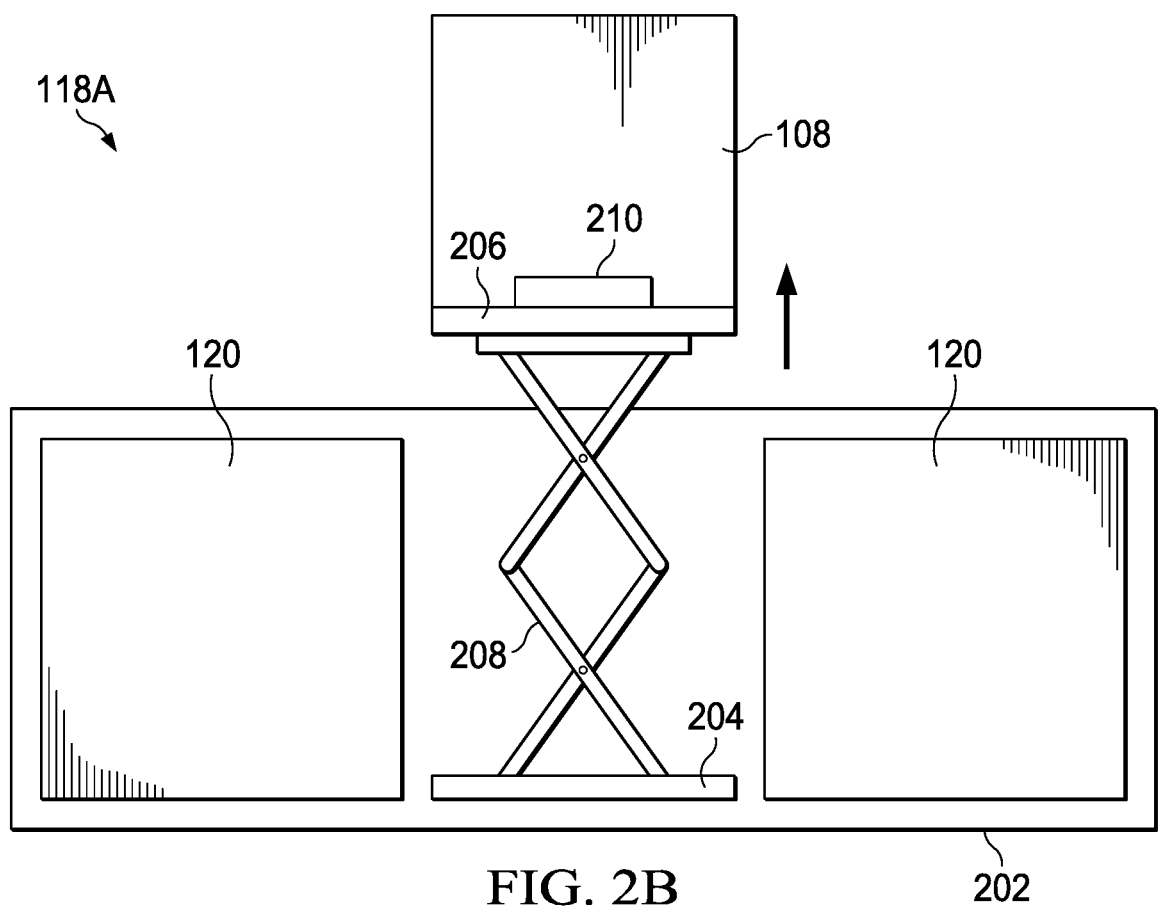

FIGS. 2A and 2B illustrate side elevation views of selected components of an example power supply module 118A, in accordance with embodiments of the present disclosure. In some embodiments of information handling system 102, power supply module 118A may be used to implement power supply module 118. As shown in FIGS. 2A and 2B, air mover 108 and power supply components 120 may be housed within an enclosure 202. As also shown in FIGS. 2A and 2B, air mover 108 may be mechanically coupled to enclosure 202 via a mechanical assembly including a fixed base 204 mechanically coupled to enclosure 202, a rotating base 206 mechanically coupled to air mover 108, and an extender 208 mechanically interfaced between fixed base 204 and rotating base 206.

Fixed base 204 may be mechanically coupled to enclosure 202 in a fixed manner relative to enclosure 202.

Extender 208 may comprise any suitable system, device, or apparatus that may mechanically interface between fixed base 204 and rotating base 206 and is mechanically extendable (e.g., in an accordion-like manner) allowing rotating base 206 and air mover 108 mechanically coupled thereto to be removed from enclosure 202 in response to a suitable force (e.g., a person servicing information handling system 102 applying a force to air mover 108), while remaining in mechanical communication with fixed base 204, when a cover (not shown in FIGS. 2A and 2B) of enclosure 202 is removed. As shown in FIGS. 2A and 2B, such removal may be in a general linear direction such that when removed from enclosure 202 as shown in FIG. 2B, extender 208 mechanically supports rotating base 206 and air mover 108 above its footprint as when it was fully received within enclosure 202 as shown in FIG. 2A.

Rotating base 206 may be rotatably coupled to extender 208 such that rotating base 206 and air mover 108 may, in response to a suitable mechanical force (e.g., a force applied by a person servicing information handling system 102), rotate relative to extender 208 and fixed base 204 about an axis generally parallel to the linear direction in which air mover 108 was removed from enclosure 202.

After servicing of air mover 108 (including rotating air mover 108 to change its direction of airflow as described in greater detail below), air mover 108 may be reinserted into enclosure 202 via application of mechanical force to cause linear motion of air mover 108 in a direction opposite to that of which air mover 108 was removed from enclosure 202.

As also shown in FIGS. 2A and 2B, air mover 108 may have an electrical connector 210 mechanically and electrically coupled thereto in order to provide electrical energy to air mover 108 from power components 120 via a cable (not shown in FIGS. 2A and 2B). In some embodiments, air mover 108 may include a similar electrical connector on an opposite side of air mover 108, to facilitate electrical connectivity of air mover 108 when air mover 108 is rotated 180 degrees from the orientation depicted in FIGS. 2A and 2B.

Figure 3A:
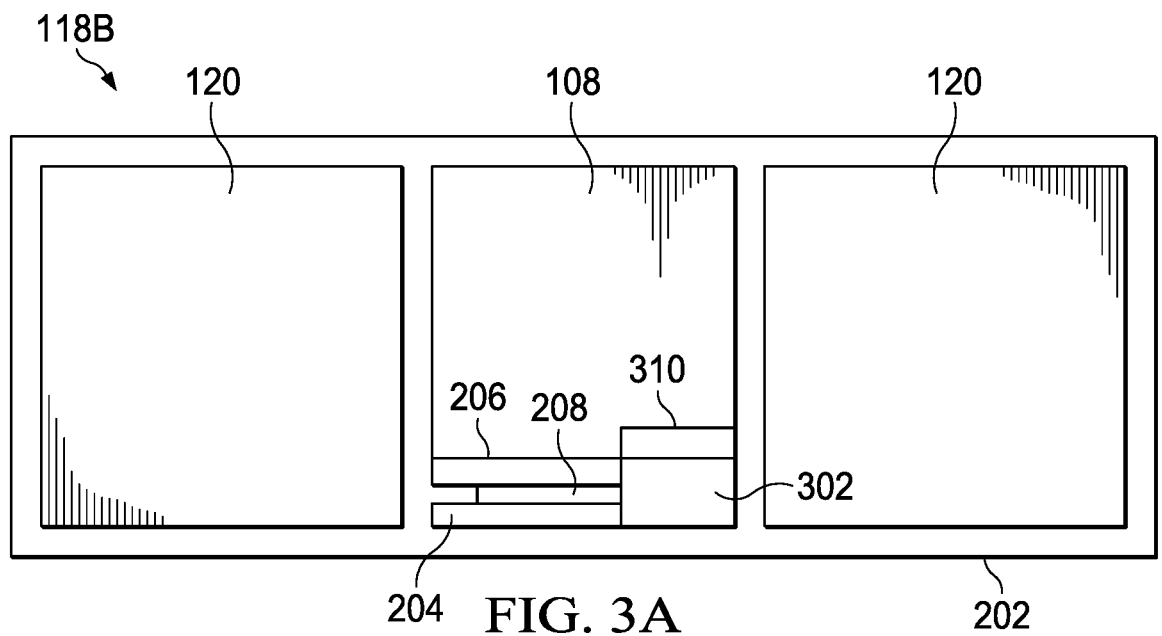
FIGS. 3A and 3B illustrate side elevation views of selected components of another example power supply module, in accordance with embodiments of the present disclosure.
Figure 3B:
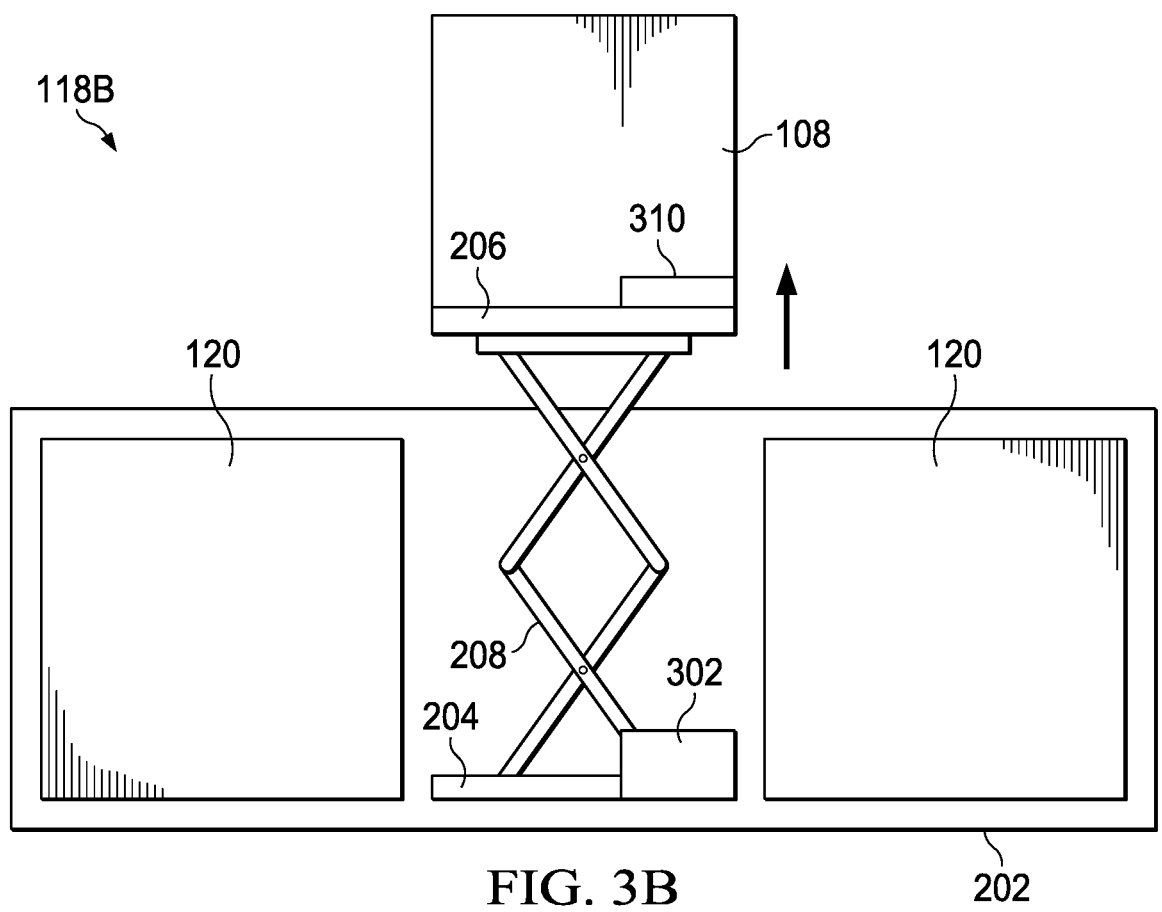

FIGS. 3A and 3B illustrate side elevation views of selected components of an example power supply module 118B, in accordance with embodiments of the present disclosure. In some embodiments of information handling system 102, power supply module 118B may be used to implement power supply module 118. Power supply module 118B may be similar to power supply module 118A in many respects, and thus, only certain differences between power supply module 118B and power supply module 118A may be described below.

One main difference between power supply module 118B and power supply module 118A is that in lieu of connector 210 configured to couple to a cable, power supply module 118B may include a connector 310 configured to mate with a corresponding connector 302 that may be mounted to a circuit board. Further, in some embodiments, air mover 108 may include a similar electrical connector on an opposite side of air mover 108, to facilitate electrical connectivity of air mover 108 when air mover 108 is rotated 180 degrees from the orientation depicted in FIGS. 3A and 3B.

To enable a user to change an airflow direction of air mover 108, a person (e.g., an administrator, technician, user, etc.) may remove power supply module 118 from chassis 100, then remove air mover 108 from enclosure 202 as described above, followed by rotating air mover 108 and rotating base 206 180 degrees relative to fixed base 204, before reinserting air mover 108 (as rotated by 180 degrees) back into enclosure 202. Once air mover 108 is inserted back into enclosure 202, the person may then reinsert power supply module 118 back into chassis 100. This process of changing airflow direction of air mover 108 is described in greater detail below with reference to FIGS. 4A-4J.

FIGS. 4A-4J illustrate a top plan view of selected components of information handling system 102, and further illustrate a method for changing airflow direction of air mover 108, in accordance with embodiments of the present disclosure. For purposes of clarity and exposition, FIGS. 4A-4J depict only a single power supply module 118. However, in some embodiments, information handling system 102 may include a plurality of power supply modules 118. Furthermore, for purposes of clarity and exposition, certain components of power supply module 118 (e.g., the mechanical assembly of fixed base 204, rotating base 206, and extender 208) are not explicitly depicted in FIGS. 4A-4J due to the fact that, in such a top plan view, such components may not be visible.

Figure 4A:
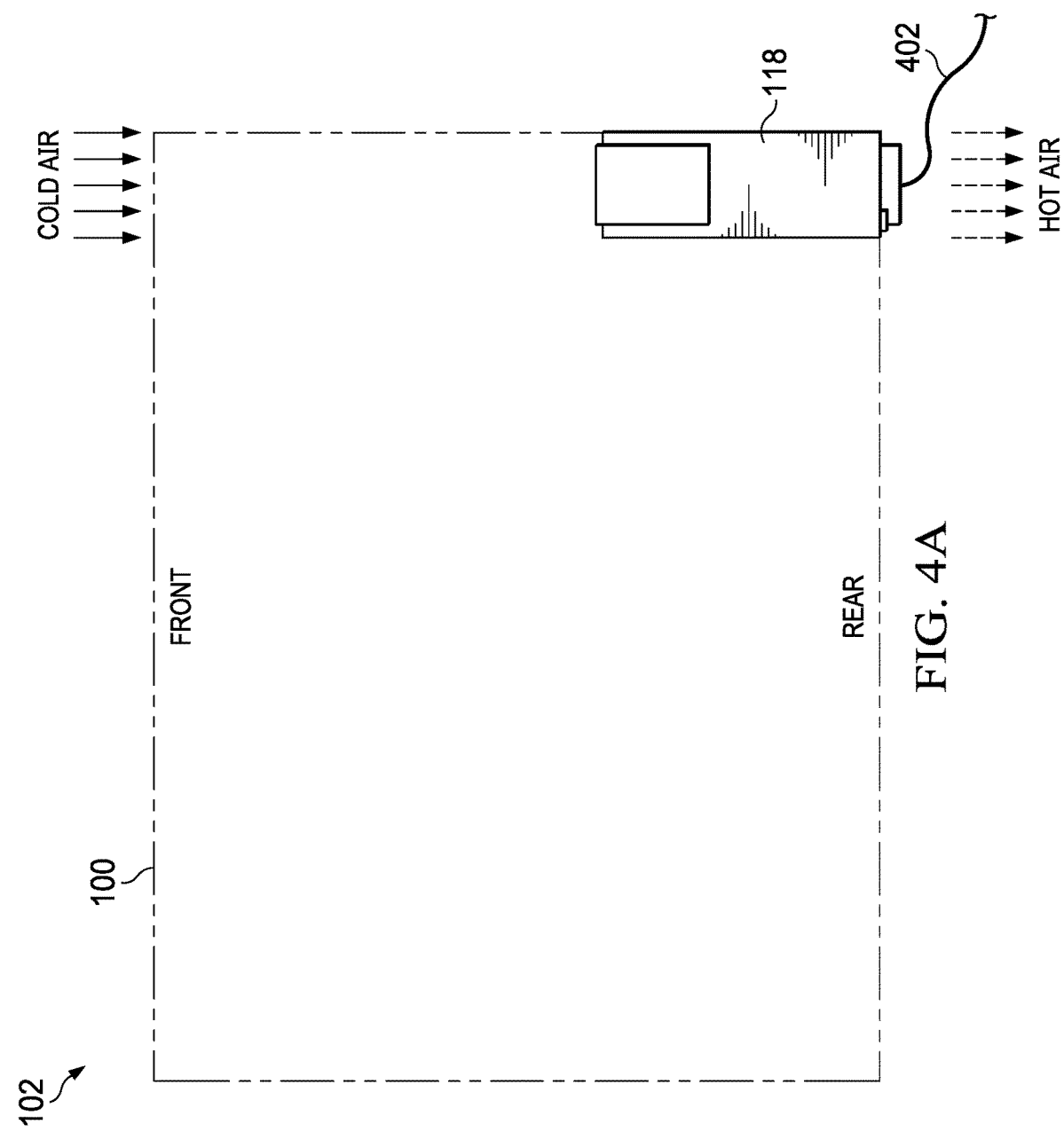

As shown in FIG. 4A, air mover 108 may be oriented in a first position relative to chassis 100, in which air mover 108 drives airflow such that cooled air is drawn from a front of information handling system 102 and warmed air is expelled through a rear of information handling system 102. The labels "front" and "rear" are arbitrary and used for purposes of convenience of exposition, and are not used to limit the scope of this disclosure. The arrangement shown in FIG. 4A may be considered to have a "normal" configuration of air mover 108.

Figure 4B:
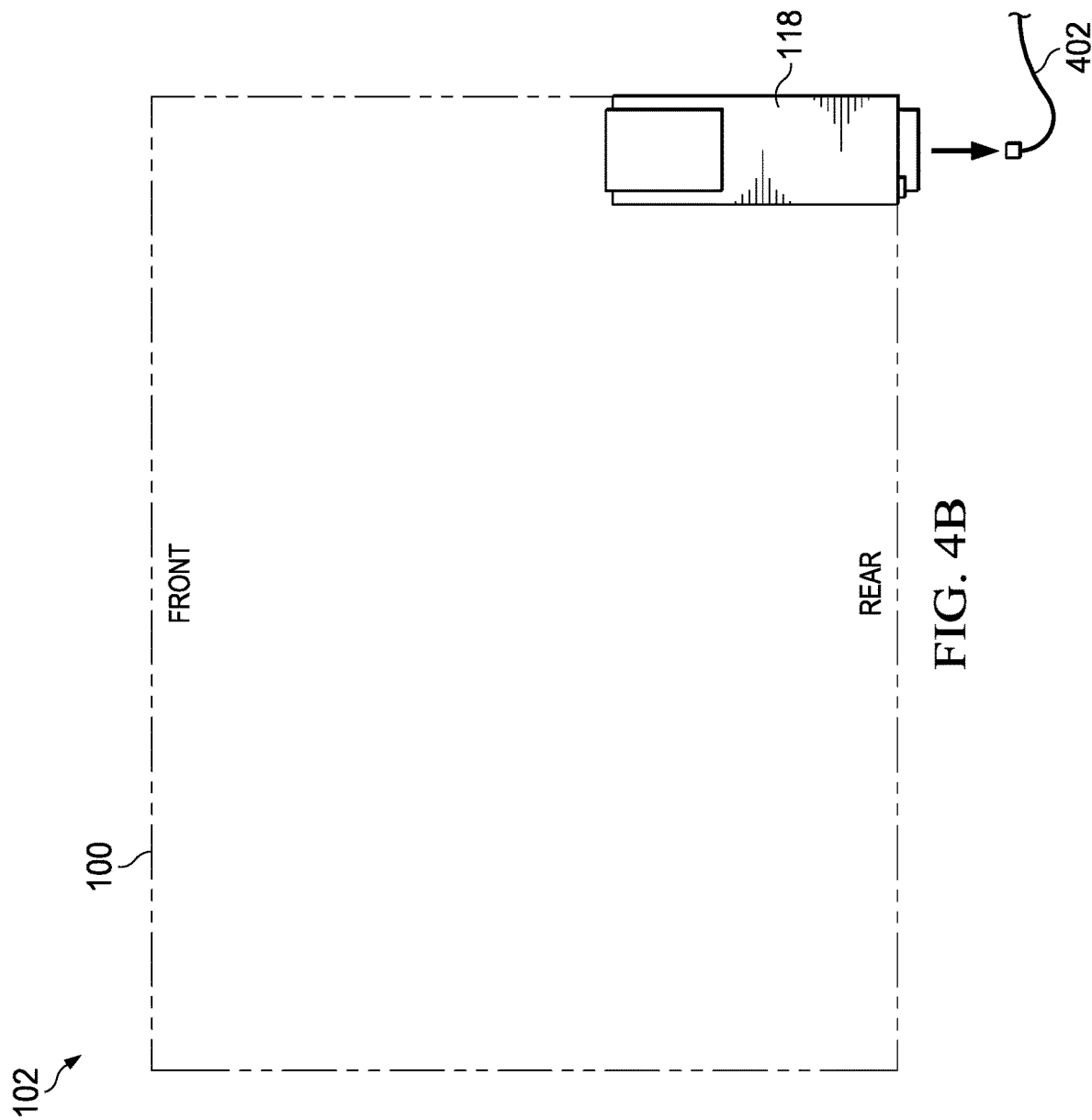

In order to change an airflow direction of air mover 108 relative to chassis 100, a power cable 402 may be removed from power supply module 118 as shown in FIG. 4B, and then power supply module 118 may be removed from chassis 100 as depicted in FIG. 4C.

Figure 4E:
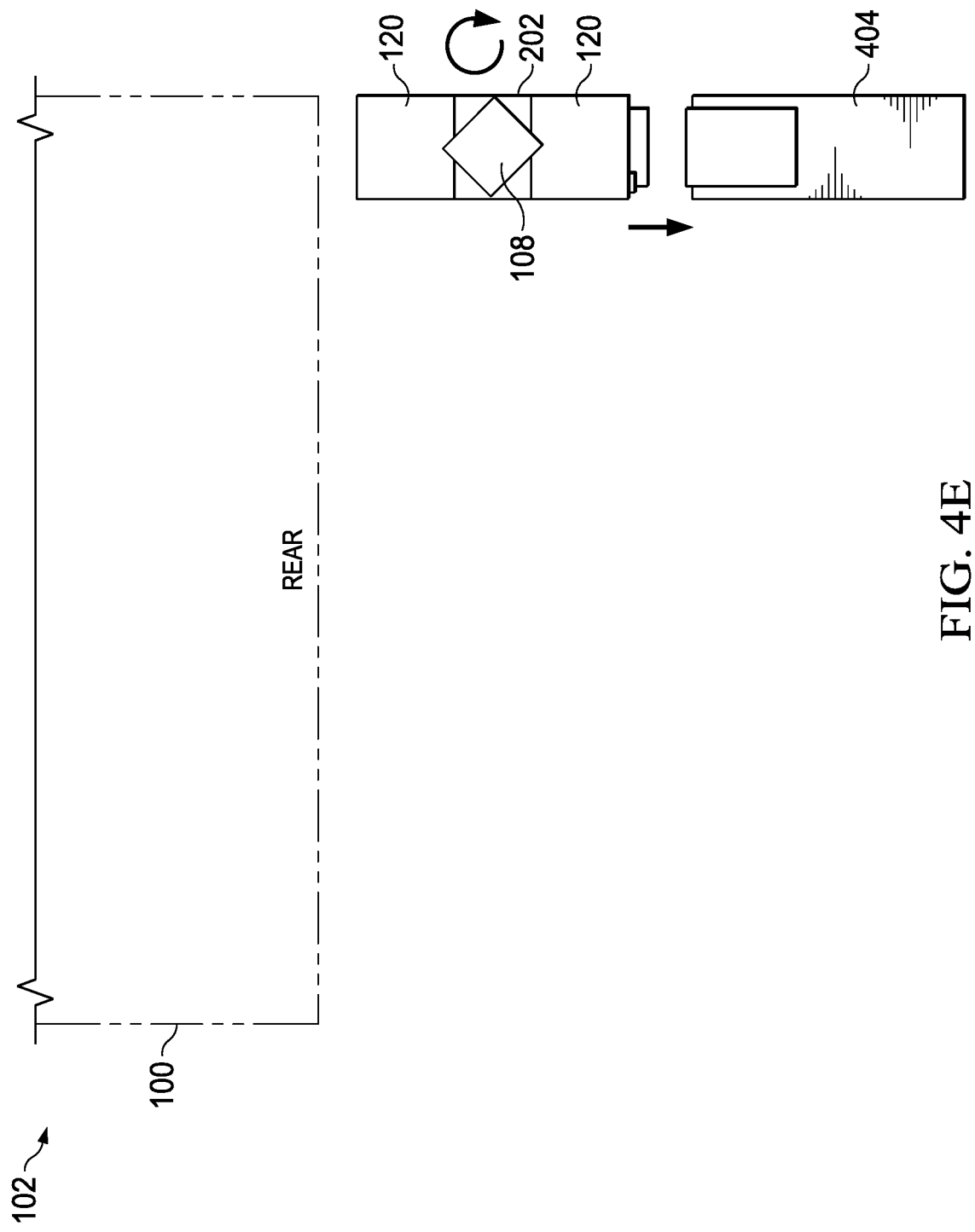

After removing power supply module 118 from chassis 100 as depicted in FIG. 4C, a person may remove a cover 404 of enclosure 202 to expose air mover 108 as shown in FIG. 4D. Then, using the mechanical assembly of fixed base 204, rotating base 206, and extender 208, the person may remove air mover 108 from enclosure 202 as describe above, and then rotate air mover 108 (and rotating base 206) relative to fixed base 204 and the remainder of enclosure 202 as shown in FIG. 4E, until air mover 108 and rotating base 206 have been rotated 180 degrees relative to fixed base 204 and the remainder of enclosure 202 as shown in FIG. 4F. The user may then reinsert air mover 108 into enclosure 202 using the mechanical assembly of fixed base 204, rotating base 206, and extender 208.

Figure 4H:
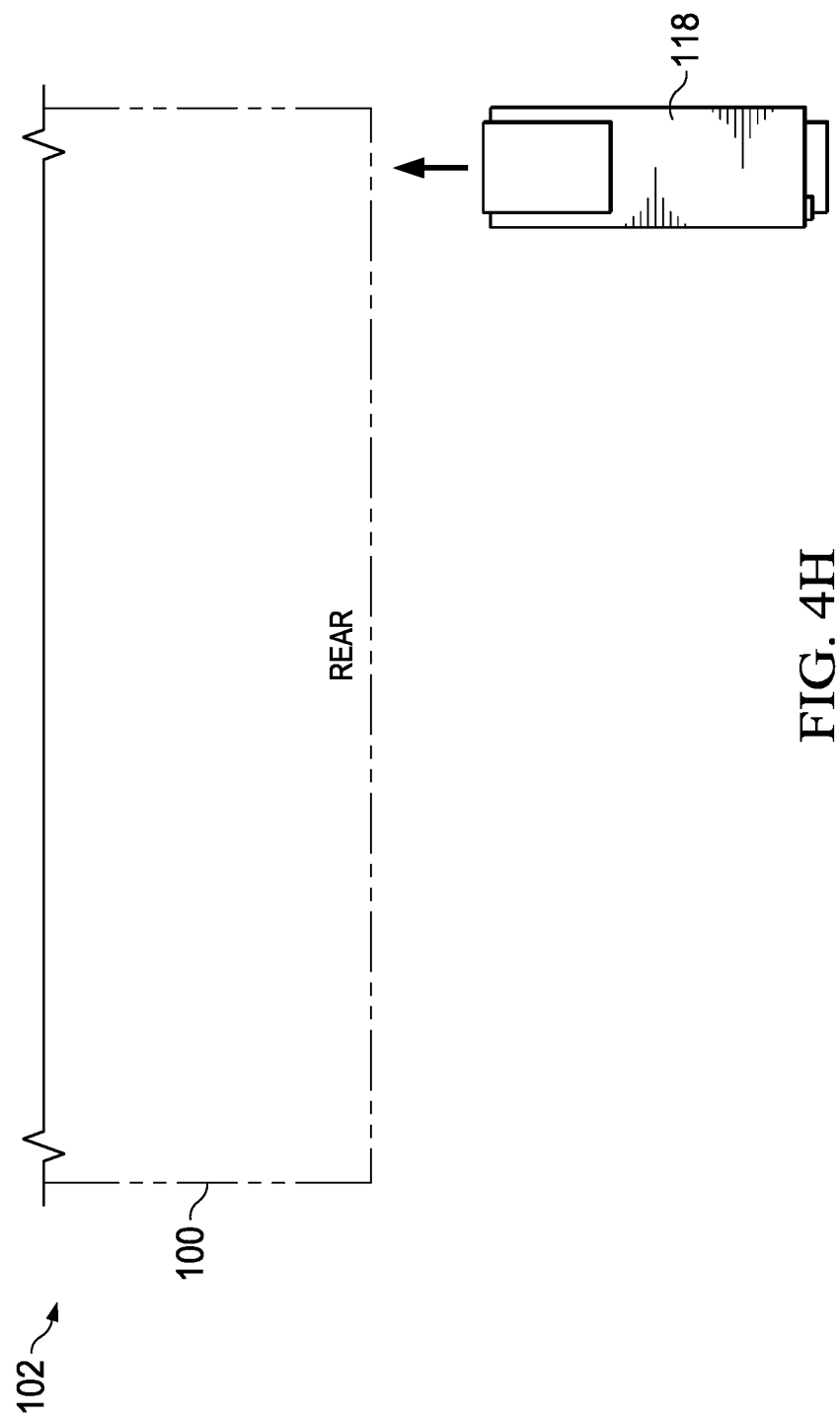

Next, the person may slide (or otherwise reattach) cover 404 back onto enclosure 202 as shown in FIG. 4G and then slide (or otherwise reinsert) power supply module 118 back into chassis 100 as shown in FIG. 4H. The person may then reattach cable 402 to power supply module 118 as shown in FIG. 4I.

As a result of the foregoing steps, as shown in FIG. 4J, air mover 108 may be oriented in a second position relative to chassis 100, in which air mover 108 drives airflow such that cooled air is drawn from the rear of information handling system 102 and warmed air is expelled through the front of information handling system 102. The arrangement shown in FIG. 4J may be considered to have a "reverse" configuration of air mover 108.

In some embodiments, air mover 108 may have electrical connectivity (e.g., dual connectivity) to a printed circuit board and/or other components of information handling system 102 such that air mover 108 may draw power and/or communicate with other components of information handling system 102 in both the normal configuration and the reverse configuration.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
    a chassis configured to house components of the information handling system; and
    a modular power supply module configured to be readily removable from the chassis and comprising:
        an enclosure;
        power supply components housed within the enclosure;
        an air mover configured to drive airflow to cool one or more components of the information handling system; and
        a mechanical assembly configured to mechanically couple the air mover to the enclosure that enables a user to remove the air mover from the enclosure while still coupled to the enclosure via the mechanical assembly, rotate the air mover 180 degrees relative to the enclosure while still coupled to the enclosure via the mechanical assembly, and reinsert the air mover into the enclosure, in order to modify a direction of airflow driven by the air mover.

2. The information handling system of claim 1, wherein the air mover comprises a connector configured to electrically couple to a cable electrically coupled to the power supply components in order to draw electrical energy.

3. The information handling system of claim 2, wherein the air mover comprises a second connector on an opposite side of the air mover from the connector and configured to electrically couple to the cable.

4. The information handling system of claim 1, wherein the air mover comprises a connector configured to electrically couple to a corresponding mating connector of a circuit board internal to the enclosure in order to draw electrical energy.

5. The information handling system of claim 4, wherein the air mover comprises a second connector on an opposite side of the air mover from the connector and configured to electrically couple to the corresponding mating connector.

6. The information handling system of claim 1, wherein the mechanical assembly comprises:
    a fixed base mechanically coupled to the enclosure;
    a rotating base mechanically coupled to the air mover; and
    an extender mechanically interfaced between the fixed base and the rotating base;
    wherein the fixed base, the rotating base, and the extender are arranged such that:
        the air mover and the rotating base are removable to allow removal of the air mover from the enclosure and reinsertion of the air mover into the enclosure in a generally linear direction; and
        the rotating base is rotatably coupled to the extender such that the rotating base and the air mover are, when the air mover is removed from the enclosure, rotatable relative to the extender and the fixed base about an axis generally parallel to the linear direction in which the air mover is removed from the enclosure.

7. A modular power supply module configured to be readily removable from a chassis of an information handling system, the modular power supply module comprising:
an enclosure;
power supply components housed within the enclosure;
an air mover configured to drive airflow to cool one or more components of the information handling system; and
a mechanical assembly configured to mechanically couple the air mover to the enclosure that enables a user to remove the air mover from the enclosure while still coupled to the enclosure via the mechanical assembly, rotate the air mover 180 degrees relative to the enclosure while still coupled to the enclosure via the mechanical assembly, and reinsert the air mover into the enclosure, in order to modify a direction of airflow driven by the air mover.

8. The modular power supply module of claim 7, wherein the air mover comprises a connector configured to electrically couple to a cable electrically coupled to power supply components in order to draw electrical energy.

9. The modular power supply module of claim 8, wherein the air mover comprises a second connector on an opposite side of the air mover from the connector and configured to electrically couple to the cable.

10. The modular power supply module of claim 7, wherein the air mover comprises a connector configured to electrically couple to a corresponding mating connector of a circuit board internal to the enclosure in order to draw electrical energy.

11. The modular power supply module of claim 10, wherein the air mover comprises a second connector on an opposite side of the air mover from the connector and configured to electrically couple to the corresponding mating connector.

12. The modular power supply module of claim 7, wherein the mechanical assembly comprises:
a fixed base mechanically coupled to the enclosure;
a rotating base mechanically coupled to the air mover; and
an extender mechanically interfaced between the fixed base and the rotating base;
wherein the fixed base, the rotating base, and the extender are arranged such that:
the air mover and the rotating base are removable to allow removal of the air mover from the enclosure and reinsertion of the air mover into the enclosure in a generally linear direction; and
the rotating base is rotatably coupled to the extender such that the rotating base and the air mover are, when the air mover is removed from the enclosure, rotatable relative to the extender and the fixed base about an axis generally parallel to the linear direction in which air mover is removed from the enclosure.

13. A method comprising:
mechanically coupling a mechanical assembly to an enclosure of a modular power supply module configured to be readily removable from a chassis of an information handling system; and
mechanically coupling the mechanical assembly to an air mover configured to drive airflow to cool one or more components of an information handling system into which the mechanical assembly is inserted, such that the air mover is removable from the enclosure while still coupled to the enclosure via the mechanical assembly, the air mover is rotatable 180 degrees relative to the enclosure while still coupled to the enclosure via the mechanical assembly, the air mover is reinsertable into the enclosure, in order to modify a direction of airflow driven by the air mover.

14. The method of claim 13, further comprising coupling a connector to the air mover wherein the connector is configured to electrically couple to a cable electrically coupled to power supply components in order to draw electrical energy.

15. The method of claim 14, further comprising coupling a second connector to the air mover on an opposite side of the air mover from the connector, wherein the second connector is configured to electrically couple to the cable.

16. The method of claim 13, further comprising coupling a connector to the air mover wherein the connector is configured to electrically couple to a corresponding mating connector of a circuit board internal to the enclosure in order to draw electrical energy.

17. The method of claim 16, further comprising coupling a second connector to the air mover on an opposite side of the air mover from the connector, wherein the second connector is configured to electrically couple to the corresponding mating connector.

18. The method of claim 13, wherein the mechanical assembly comprises:
a fixed base mechanically coupled to the enclosure;
a rotating base mechanically coupled to the air mover; and
an extender mechanically interfaced between the fixed base and the rotating base;
wherein the fixed base, the rotating base, and the extender are arranged such that:
the air mover and the rotating base are removable to allow removal of the air mover from the enclosure and reinsertion of the air mover into the enclosure in a generally linear direction; and
the rotating base is rotatably coupled to the extender such that the rotating base and the air mover are, when the air mover is removed from the enclosure, rotatable relative to the extender and the fixed base about an axis generally parallel to the linear direction in which the air mover is removed from the enclosure.

* * * * *